(12) United States Patent
He et al.

(10) Patent No.: US 11,087,713 B1
(45) Date of Patent: Aug. 10, 2021

(54) GATE DRIVING CIRCUIT AND DISPLAY PANEL

(71) Applicant: SHENZHEN CHINA STAR OPTOELECTRONICS SEMICONDUCTOR DISPLAY TECHNOLOGY CO., LTD., Guangdong (CN)

(72) Inventors: Xiaojin He, Guangdong (CN); Bangyin Peng, Guangdong (CN); Ilgon Kim, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/252,302

(22) PCT Filed: Nov. 24, 2020

(86) PCT No.: PCT/CN2020/130996
§ 371 (c)(1),
(2) Date: Dec. 15, 2020

(30) Foreign Application Priority Data

Aug. 17, 2020 (CN) .................... CN202021705559.1

(51) Int. Cl.
*G09G 3/36* (2006.01)

(52) U.S. Cl.
CPC .... *G09G 3/3696* (2013.01); *G09G 2300/0426* (2013.01); *G09G 2310/08* (2013.01)

(58) Field of Classification Search
CPC ... G09G 2310/0286; G09G 2300/0426; G09G 2310/08; G09G 2300/0408; G09G 2310/0264; G09G 3/3674; G09G 3/3266; G09G 3/3696
See application file for complete search history.

(56) References Cited

U.S. PATENT DOCUMENTS

| | | | | |
|---|---|---|---|---|
| 2015/0371599 A1* | 12/2015 | Xiao | ......................... | G09G 3/36 345/212 |
| 2016/0189649 A1* | 6/2016 | Xiao | ..................... | G09G 3/3677 345/214 |
| 2016/0189652 A1* | 6/2016 | Xiao | ..................... | H03K 17/162 327/109 |
| 2016/0284296 A1* | 9/2016 | Dai | ....................... | G09G 3/3677 |
| 2016/0351152 A1* | 12/2016 | Dai | ..................... | H01L 29/7869 |
| 2017/0193937 A1* | 7/2017 | Du | ........................ | G09G 3/3674 |
| 2018/0268768 A1* | 9/2018 | Lv | ........................... | G11C 19/28 |

* cited by examiner

*Primary Examiner* — Hong Zhou

(57) ABSTRACT

A gate driving circuit and a display panel are provided. The gate driving circuit includes N gate driver on array (GOA) units, wherein the N GOA units are cascaded. An nth-stage GOA unit is any one of the N GOA units. The N GOA units include at least one first GOA unit and at least one second GOA unit. Each first GOA unit and each second GOA unit include pull-up control circuits, bootstrap capacitors, pull-up circuits, pull-down circuits, and pull-down holding circuits. Each second GOA unit further includes a reset circuit.

20 Claims, 3 Drawing Sheets

GATE DRIVING CIRCUIT AND DISPLAY PANEL

FIELD OF INVENTION

The present disclosure relates to a technical field of displays, and more particularly to a gate driving circuit and a display panel.

BACKGROUND OF INVENTION

For gate driver on array (GOA) technology, scan line driving circuits are integrated on array substrates of liquid crystal panels, thereby reducing product cost in terms of material cost and manufacturing processes.

For high-resolution (e.g., 8K) and high-frequency display panels, because resolution is increased, layouts of gate driving circuits are more complicated. In the related art, in order to simplify a layout design of a gate driving circuit, a start signal line and a reset signal line are usually implemented by one signal line. When first few stages of the gate driving circuit start to operate, a conventional reset circuit is turned on by inputting a high electric potential of a start signal, causing the start signal and a direct current (DC) low electric potential source to be directly short-circuited. Thus, a larger current in the gate driving circuit triggers overcurrent protection of the gate driving circuit, resulting in an abnormal black screen of a product.

Currently, there is an urgent need for a gate driving circuit that solves the aforementioned technical problem.

SUMMARY OF INVENTION

Technical problems are as follows. The present disclosure provides a gate driving circuit and a display panel to solve a technical problem of an abnormal black screen of an existing display panel.

Technical solutions are as follows. The present disclosure provides a gate driving circuit, including: N gate driver on array (GOA) units; wherein the N GOA units are cascaded; wherein the N GOA units include at least one first GOA unit and at least one second GOA unit; wherein an nth-stage GOA unit is configured to output a gate driving signal to an nth-stage scan line; wherein the nth-stage GOA unit is any one of the N GOA units; and wherein any one of each first GOA unit and each second GOA unit includes:

a pull-up control circuit configured to, in a first period, pull up a control node (Qn) of the nth-stage GOA unit to a first high electric potential and charge a bootstrap capacitor;

the bootstrap capacitor configured to, in a second period, hold an electric potential of the control node (Qn) of the nth-stage GOA unit at the first high electric potential;

a pull-up circuit configured to, in response to a clock signal and the first high electric potential of the control node (Qn) of the nth-stage GOA unit, output the gate driving signal to a gate signal terminal (Gn) of the nth-stage GOA unit;

a pull-down circuit configured to, in a third period, pull down the electric potential of the control node (Qn) of the nth-stage GOA unit to a first direct current (DC) low electric potential and pull down an electric potential of the gate signal terminal (Gn) of the nth-stage GOA unit to a second DC low electric potential; and a pull-down holding circuit configured to, in a fourth period, hold the electric potential of the control node (Qn) of the nth-stage GOA unit at the first DC low electric potential and hold the electric potential of the gate signal terminal (Gn) of the nth-stage GOA unit at the second DC low electric potential;

wherein the pull-up control circuit is electrically coupled to the pull-up circuit, the pull-down circuit, the pull-down holding circuit, and the bootstrap capacitor; wherein the first DC low electric potential is electrically coupled to the pull-down holding circuit and the pull-down circuit; wherein the second DC low electric potential is electrically coupled to the pull-down holding circuit and the pull-down circuit; and wherein a clock signal terminal (CK) is electrically coupled to the pull-up circuit;

wherein each second GOA unit further includes a reset circuit configured to, in a fifth period, reset an electric potential of the control node (Qn); and wherein the reset circuit is electrically coupled to the pull-up control circuit and the first DC low electric potential.

In the gate driving circuit of the present disclosure, each first GOA unit includes a first pull-up control circuit coupled to a start signal terminal (STV) and a control node (Qa) of an ath-stage GOA unit;

wherein each second GOA unit includes a second pull-up control circuit coupled to a stage transfer signal terminal (STb−1) and a gate signal terminal (Gb−1) of a (b−1)th-stage GOA unit, a control node (Qb) of a bth-stage GOA unit, and the reset circuit of a present stage;

wherein a value range of a is a first value set, a value range of b is a second value set, intersection of the first value set and the second value set is an empty set, $1 \leq a \leq n$, $1 \leq b \leq n$, a, b and n are positive integers, and a is not equal to b.

In the gate driving circuit of the present disclosure, the first value set is a set of positive integers ranging from 1 to 12.

In the gate driving circuit of the present disclosure, the first pull-up control circuit includes an eleventh thin film transistor (TFT) (T11); and wherein a gate and a source of the eleventh TFT (T11) are coupled to the start signal terminal (STV), and a drain of the eleventh TFT (T11) is coupled to the control node (Qa) of the ath-stage GOA unit;

wherein the second pull-up control circuit includes an eleventh TFT (T11); and wherein a gate of the eleventh TFT (T11) is coupled to the stage transfer signal terminal (STb−1) of the (b−1)th-stage GOA unit, a source of the eleventh TFT (T11) is coupled to the gate signal terminal (Gb−1) of the (b−1)th-stage GOA unit, and a drain of the eleventh TFT (T11) is coupled to the control node (Qb) of the bth-stage GOA unit.

In the gate driving circuit of the present disclosure, the bootstrap capacitor is coupled to the control node (Qn) of the nth-stage GOA unit, the gate signal terminal (Gn) of the nth-stage GOA unit, the pull-down holding circuit, and the pull-up circuit;

wherein a first terminal of the bootstrap capacitor is coupled to the control node (Qn) of the nth-stage GOA unit and the pull-up circuit, and a second terminal of the bootstrap capacitor is coupled to the gate signal terminal (Gn) of the nth-stage GOA unit and the pull-down holding circuit.

In the gate driving circuit of the present disclosure, the pull-up circuit is coupled to the control node (Qn) of the nth-stage GOA unit, the clock signal terminal (CK), a stage transfer signal terminal (STn) of the nth-stage GOA unit, and the nth-stage gate signal terminal (Gn);

wherein the pull-up circuit includes a twenty-first TFT (T21) and a twenty-second TFT (T22);

wherein a gate of the twenty-first TFT (T21) is coupled to the control node (Qn) of the nth-stage GOA unit, a source of the twenty-first TFT (T21) is coupled to the clock signal terminal (CK), and a drain of the twenty-first TFT (T21) is coupled to the nth-stage gate signal terminal (Gn);

wherein a gate of the twenty-second TFT (T22) is coupled to the control node (Qn) of the nth-stage GOA unit, a source of the twenty-second TFT (T22) is coupled to the clock signal terminal (CK), and a drain of the twenty-second TFT (T22) is coupled to the stage transfer signal terminal (STn) of the nth-stage GOA unit.

In the gate driving circuit of the present disclosure, the pull-down circuit is coupled to the control node (Qn) of the nth-stage GOA unit, the gate signal terminal (Gn) of the nth-stage GOA unit, a gate signal terminal (Gn+1) of an (n+1)th-stage GOA unit, and a second DC low electric potential terminal (VSSG);

wherein the first DC low electric potential terminal (VSSQ) provides the first DC low electric potential, and the second DC low electric potential terminal (VSSG) provides the second DC low electric potential.

In the gate driving circuit of the present disclosure, the pull-down circuit includes a thirty-first TFT (T31) and a forty-first TFT (T41);

wherein a source of the thirty-first TFT (T31) is coupled to the gate signal terminal (Gn) of the nth-stage GOA unit, and a source of the forty-first TFT (T41) is coupled to the control node (Qn) of the nth-stage GOA unit;

wherein the thirty-first TFT (T31) is coupled to the second DC low electric potential terminal (VSSG), and a drain of the forty-first TFT (T41) is coupled to the first DC low electric potential terminal (VSSQ);

wherein a gate of the thirty-first TFT (T31) and a gate of the forty-first TFT (T41) are coupled to the gate signal terminal (Gn+1) of the (n+1)th-stage GOA unit.

In the gate driving circuit of the present disclosure, the pull-down holding circuit includes a first pull-down holding unit and a second pull-down holding unit;

wherein the first pull-down holding unit is coupled to a first high voltage signal, the control node (Qn) of the nth-stage GOA unit, the gate signal terminal (Gn) of the nth-stage GOA unit, a first DC low electric potential terminal (VSSQ), and a second DC low electric potential terminal (VSSG);

wherein the second pull-down holding unit is coupled to a second high voltage signal, the control node (Qn) of the nth-stage GOA unit, the gate signal terminal (Gn) of the nth-stage GOA unit, a first DC low electric potential terminal (VSSQ), and a second DC low electric potential terminal (VSSG).

In the gate driving circuit of the present disclosure, in each second GOA unit, the reset circuit includes a forty-fourth TFT (T44); and wherein a gate of the forty-fourth TFT (T44) is coupled to the start signal terminal (SW), a source of the forty-fourth TFT (T44) is coupled to the control node (Qb) of the bth-stage GOA unit, and a drain of the forty-fourth TFT (T44) is coupled to the first DC low electric potential terminal (VSSQ).

The present disclosure provides a display panel including: a gate driving circuit including N gate driver on array (GOA) units; wherein the N GOA units are cascaded; wherein the N GOA units include at least one first GOA unit and at least one second GOA unit; wherein an nth-stage GOA unit is configured to output a gate driving signal to an nth-stage scan line; wherein the nth-stage GOA unit is any one of the N GOA units; and wherein any one of each first GOA unit and each second GOA unit includes:

a pull-up control circuit configured to, in a first period, pull up a control node (Qn) of the nth-stage GOA unit to a first high electric potential and charge a bootstrap capacitor;

the bootstrap capacitor configured to, in a second period, hold an electric potential of the control node (Qn) of the nth-stage GOA unit at the first high electric potential;

a pull-up circuit configured to, in response to a clock signal and the first high electric potential of the control node (Qn) of the nth-stage GOA unit, output the gate driving signal to a gate signal terminal (Gn) of the nth-stage GOA unit;

a pull-down circuit configured to, in a third period, pull down the electric potential of the control node (Qn) of the nth-stage GOA unit to a first direct current (DC) low electric potential and pull down an electric potential of the gate signal terminal (Gn) of the nth-stage GOA unit to a second DC low electric potential; and a pull-down holding circuit configured to, in a fourth period, hold the electric potential of the control node (Qn) of the nth-stage GOA unit at the first DC low electric potential and hold the electric potential of the gate signal terminal (Gn) of the nth-stage GOA unit at the second DC low electric potential;

wherein the pull-up control circuit is electrically coupled to the pull-up circuit, the pull-down circuit, the pull-down holding circuit, and the bootstrap capacitor; wherein the first DC low electric potential is electrically coupled to the pull-down holding circuit and the pull-down circuit; wherein the second DC low electric potential is electrically coupled to the pull-down holding circuit and the pull-down circuit; and wherein a clock signal terminal (CK) is electrically coupled to the pull-up circuit;

wherein each second GOA unit further includes a reset circuit configured to, in a fifth period, reset an electric potential of the control node (Qn); and wherein the reset circuit is electrically coupled to the pull-up control circuit and the first DC low electric potential.

In the display panel of the present disclosure, each first GOA unit includes a first pull-up control circuit coupled to a start signal terminal (SW) and a control node (Qa) of an ath-stage GOA unit;

wherein each second GOA unit includes a second pull-up control circuit coupled to a stage transfer signal terminal (STb−1) and a gate signal terminal (Gb−1) of a (b−1)th-stage GOA unit, a control node (Qb) of a bth-stage GOA unit, and the reset circuit of a present stage;

wherein a value range of a is a first value set, a value range of b is a second value set, intersection of the first value set and the second value set is an empty set, 1≤a≤n, 1≤b≤n, a, b and n are positive integers, and a is not equal to b.

In the display panel of the present disclosure, the first value set is a set of positive integers ranging from 1 to 12.

In the display panel of the present disclosure, the first pull-up control circuit includes an eleventh thin film transistor (TFT) (T11); and wherein a gate and a source of the eleventh TFT (T11) are coupled to the start signal terminal (STV), and a drain of the eleventh TFT (T11) is coupled to the control node (Qa) of the ath-stage GOA unit;

wherein the second pull-up control circuit includes an eleventh TFT (T11); and wherein a gate of the eleventh TFT (T11) is coupled to the stage transfer signal terminal (STb−1) of the (b−1)th-stage GOA unit, a source of the eleventh TFT (T11) is coupled to the gate signal terminal (Gb−1) of the (b−1)th-stage GOA unit, and a drain of the eleventh TFT (T11) is coupled to the control node (Qb) of the bth-stage GOA unit.

In the display panel of the present disclosure, the bootstrap capacitor is coupled to the control node (Qn) of the nth-stage GOA unit, the gate signal terminal (Gn) of the nth-stage GOA unit, the pull-down holding circuit, and the pull-up circuit;

wherein a first terminal of the bootstrap capacitor is coupled to the control node (Qn) of the nth-stage GOA unit and the pull-up circuit, and a second terminal of the bootstrap capacitor is coupled to the gate signal terminal (Gn) of the nth-stage GOA unit and the pull-down holding circuit.

In the display panel of the present disclosure, the pull-up circuit is coupled to the control node (Qn) of the nth-stage GOA unit, the clock signal terminal (CK), a stage transfer signal terminal (STn) of the nth-stage GOA unit, and the nth-stage gate signal terminal (Gn);

wherein the pull-up circuit includes a twenty-first TFT (T21) and a twenty-second TFT (T22);

wherein a gate of the twenty-first TFT (T21) is coupled to the control node (Qn) of the nth-stage GOA unit, a source of the twenty-first TFT (T21) is coupled to the clock signal terminal (CK), and a drain of the twenty-first TFT (T21) is coupled to the nth-stage gate signal terminal (Gn);

wherein a gate of the twenty-second TFT (T22) is coupled to the control node (Qn) of the nth-stage GOA unit, a source of the twenty-second TFT (T22) is coupled to the clock signal terminal (CK), and a drain of the twenty-second TFT (T22) is coupled to the stage transfer signal terminal (STn) of the nth-stage GOA unit.

In the display panel of the present disclosure, the pull-down circuit is coupled to the control node (Qn) of the nth-stage GOA unit, the gate signal terminal (Gn) of the nth-stage GOA unit, a gate signal terminal (Gn+1) of an (n+1)th-stage GOA unit, and a second DC low electric potential terminal (VSSG);

wherein the first DC low electric potential terminal (VSSQ) provides the first DC low electric potential, and the second DC low electric potential terminal (VSSG) provides the second DC low electric potential;

wherein the pull-down circuit includes a thirty-first TFT (T31) and a forty-first TFT (T41);

wherein a source of the thirty-first TFT (T31) is coupled to the gate signal terminal (Gn) of the nth-stage GOA unit, and a source of the forty-first TFT (T41) is coupled to the control node (Qn) of the nth-stage GOA unit;

wherein the thirty-first TFT (T31) is coupled to the second DC low electric potential terminal (VSSG), and a drain of the forty-first TFT (T41) is coupled to the first DC low electric potential terminal (VSSQ);

wherein a gate of the thirty-first TFT (T31) and a gate of the forty-first TFT (T41) are coupled to the gate signal terminal (Gn+1) of the (n+1)th-stage GOA unit.

In the display panel of the present disclosure, the pull-down holding circuit includes a first pull-down holding unit and a second pull-down holding unit;

wherein the first pull-down holding unit is coupled to a first high voltage signal, the control node (Qn) of the nth-stage GOA unit, the gate signal terminal (Gn) of the nth-stage GOA unit, a first DC low electric potential terminal (VSSQ), and a second DC low electric potential terminal (VSSG);

wherein the second pull-down holding unit is coupled to a second high voltage signal, the control node (Qn) of the nth-stage GOA unit, the gate signal terminal (Gn) of the nth-stage GOA unit, a first DC low electric potential terminal (VSSQ), and a second DC low electric potential terminal (VSSG).

In the display panel of the present disclosure, a period of the first high voltage signal and the second high voltage signal is a multiple of a frame period; wherein the first high voltage signal and the second high voltage signal are low frequency signals having a duty cycle of 50%; and wherein a phase difference between the first high voltage signal and the second high voltage signal is ½.

In the display panel of the present disclosure, in each second GOA unit, the reset circuit includes a forty-fourth TFT (T44); and wherein a gate of the forty-fourth TFT (T44) is coupled to the start signal terminal (STV), a source of the forty-fourth TFT (T44) is coupled to the control node (Qb) of the bth-stage GOA unit, and a drain of the forty-fourth TFT (T44) is coupled to the first DC low electric potential terminal (VSSQ).

Advantageous effects are as follows. In the present disclosure, a reset circuit in each of at least one initial-stage GOA unit is eliminated by configuring, in different stages, GOA units having different structures, respectively. The technical problem that in an initial period, the reset circuit causes the start signal and a low electric potential source to be short-circuited, resulting in an abnormal black screen of a product is avoided.

DETAILED DESCRIPTION OF PREFERRED EMBODIMENTS

In order to make the objects, technical solutions, and advantages of the present disclosure more clearly, the present disclosure is further described in detail below with embodiments with reference to the accompanying drawings. It is understood that the specific embodiments described herein are merely illustrative of the present disclosure and are not intended to limit the present disclosure.

For a high-resolution (e.g., 8K) and high-frequency display panel, a start signal line and a reset signal line are usually implemented by one signal line. When first few stages of the gate driving circuit start to operate, a conventional reset circuit is turned on by inputting a high electric potential of a start signal, causing the start signal and a direct current (DC) low electric potential source to be directly short-circuited. Thus, a larger current in the gate driving circuit triggers overcurrent protection of the gate driving circuit, resulting in an abnormal black screen of a product. On the basis of the aforementioned technical problem, the present disclosure provides the following technical solutions.

Figure 1:
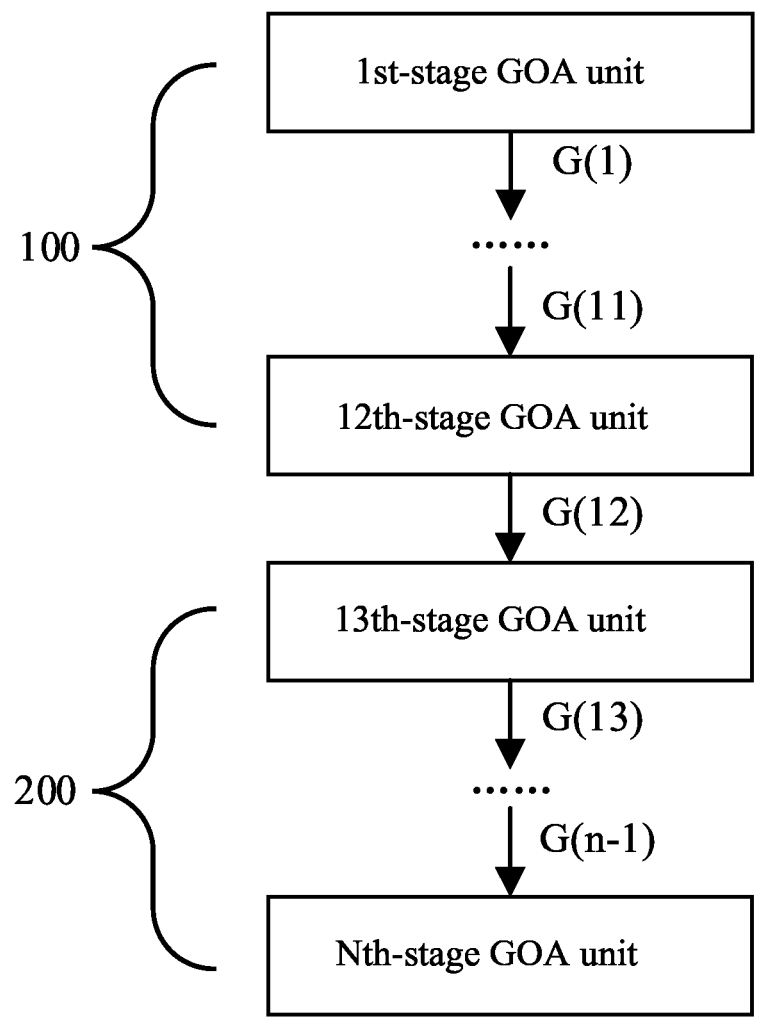
FIG. 1 is a schematic structural diagram of a gate driving circuit according to the present disclosure.
Figure 2:
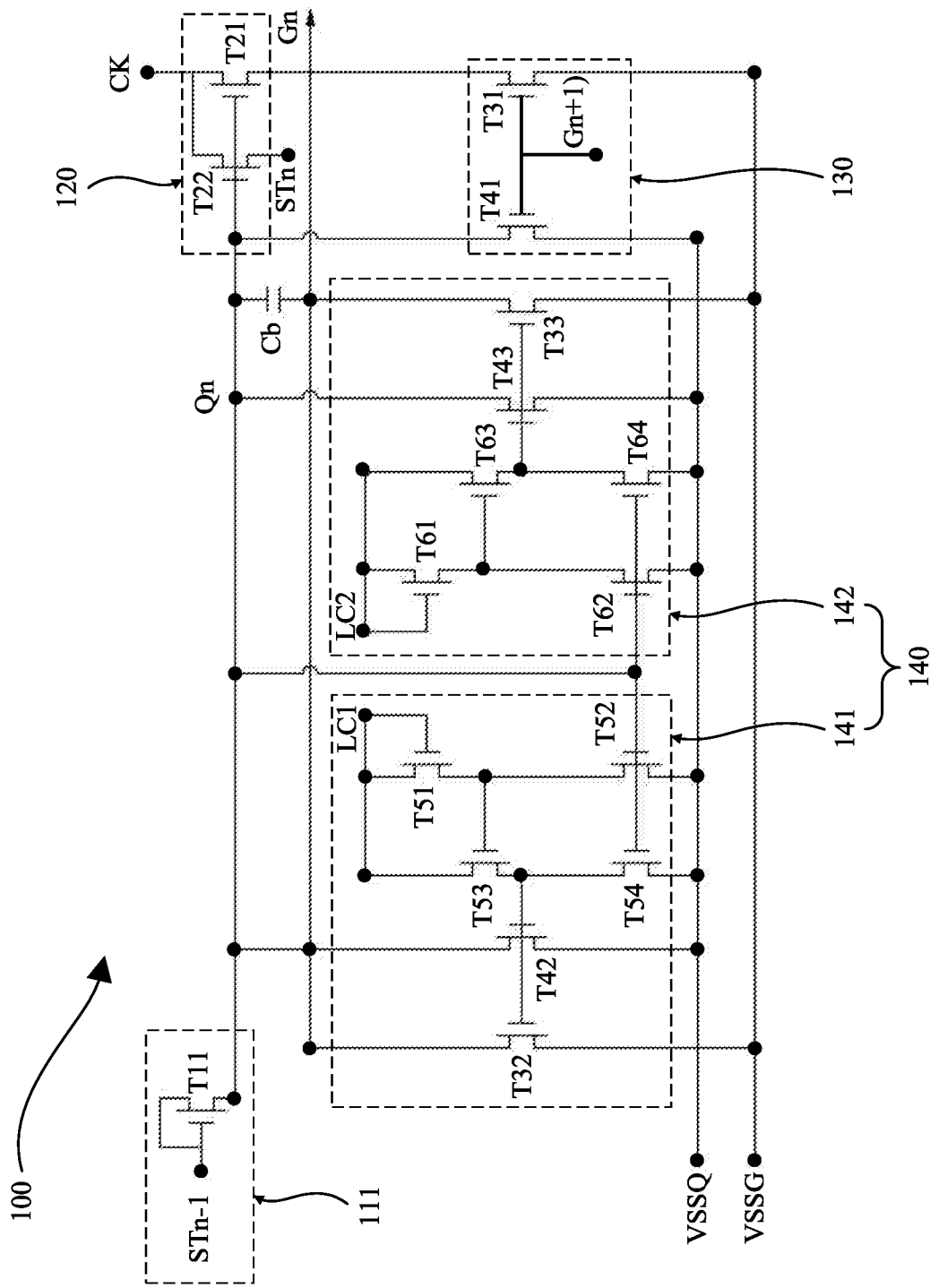
FIG. 2 is a structural diagram of a first gate driver on array (GOA) unit in the gate driving circuit according to the present disclosure.
Figure 3:
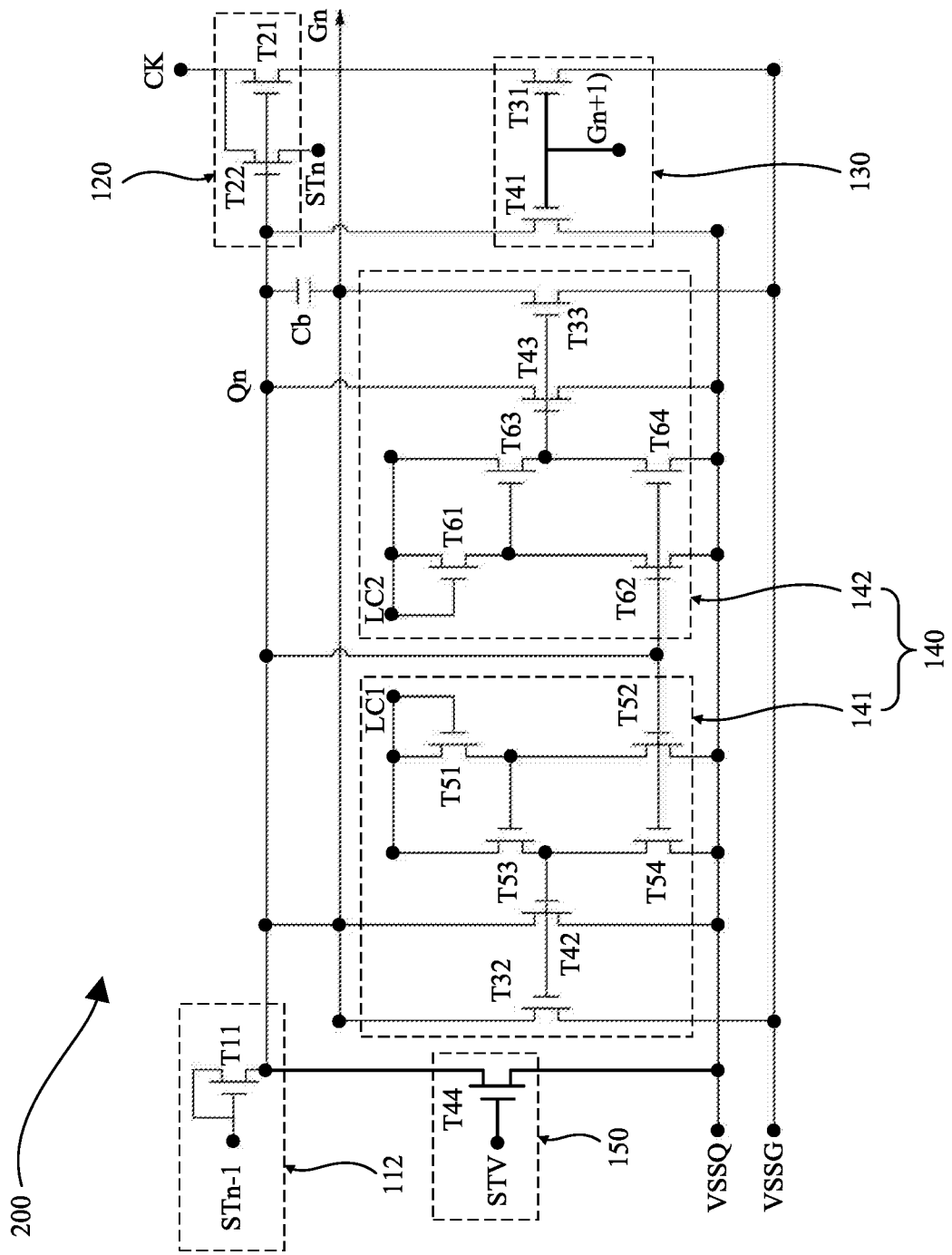
FIG. 3 is a structural diagram of a second GOA unit in the gate driving circuit according to the present disclosure.

Referring to FIGS. 1 to 3, the present disclosure provides a gate driving circuit. The gate driving circuit includes N gate driver on array (GOA) units. The N GOA units are cascaded. The N GOA units include at least one first GOA unit 100 and at least one second GOA unit 200. An nth-stage GOA unit is configured to output a gate driving signal to an nth-stage scan line. The nth-stage GOA unit is any one of the N GOA units, and n and N are positive integers.

Any one of each first GOA unit 100 and each second GOA unit 200 includes a pull-up control circuit, a bootstrap capacitor, a pull-up circuit 120, a pull-down circuit 130, and a pull-down holding circuit 140.

The pull-up control circuit is configured to, in a first period, pull up a control node Qn of the nth-stage GOA unit to a first high electric potential and charge the bootstrap capacitor.

The bootstrap capacitor is configured to, in a second period, hold an electric potential of the control node Qn of the nth-stage GOA unit at the first high electric potential.

The pull-up circuit 120 is configured to, in response to a clock signal and the first high electric potential of the control node Qn of the nth-stage GOA unit, output the gate driving signal to a gate signal terminal Gn of the nth-stage GOA unit;

The pull-down circuit 130 is configured to, in a third period, pull down the electric potential of the control node Qn of the nth-stage GOA unit to a first direct current (DC) low electric potential and pull down an electric potential of the gate signal terminal Gn of the nth-stage GOA unit to a second DC low electric potential.

The pull-down holding circuit 140 is configured to, in a fourth period, hold the electric potential of the control node Qn of the nth-stage GOA unit at the first DC low electric potential and hold the electric potential of the gate signal terminal Gn of the nth-stage GOA unit at the second DC low electric potential.

Each second GOA unit 200 further includes a reset circuit 150 configured to, in a fifth period, reset an electric potential of the control node Qn.

In the present disclosure, a reset circuit 150 in each of at least one initial-stage GOA unit is eliminated by configuring, in different stages, GOA units having different structures, respectively. The technical problem that in an initial period, the reset circuit 150 causes the start signal and a low electric potential source to be short-circuited, resulting in an abnormal black screen of a product is avoided.

The technical solutions of the present disclosure will now be described in conjunction with the specific embodiments.

Referring to FIG. 1, in the gate driving circuit of the present disclosure, a number of the at least one first GOA unit 100 can be X, and a number of the at least one second GOA unit 200 can be N-X. Arrangement of at least one stage number of the at least one first GOA unit 100 is configured according to a first value set A. At least one stage number of the at least one second GOA unit 200 is configured according to a second value set B. For example, the first value set A is {1,2,4,10,15}. That is, a first-stage GOA unit, a second-stage GOA unit, a fourth-stage GOA unit, a tenth-stage GOA unit, and a fifteenth-stage GOA unit are the at least one first GOA unit 100. The remaining GOA units are the at least one second GOA unit 200.

In the following embodiments, an ath-stage GOA unit is defined as each first GOA unit 100, and a bth-stage GOA unit is defined as each second GOA unit 200. A value of a is the first value set, a value of b is the second value set, intersection of the first value set and the second value set is an empty set, $1 \le a \le n$, $1 \le b \le n$, a, b and n are positive integers, and a is not equal to b.

Referring to FIG. 2, in each first GOA unit 100, the first pull-up control circuit 111 is configured to, in a first period, receive an activation signal of a start signal terminal SW, pull up a control node Qa of the ath-stage GOA unit to the first high electric potential and charge the bootstrap capacitor Cb.

In the present embodiment, the first pull-up control circuit 111 is coupled to the start signal terminal STV and the control node Qa of the ath-stage GOA unit. The activation signal is from the start signal terminal STV.

In the first period, the first pull-up control circuit 111 receives the activation signal from the start signal terminal SW and causes, in response to the activation signal of the start signal terminal SW, the control node Qa of the ath-stage GOA unit to be at the first high electric potential.

In the present embodiment, the first pull-up control circuit 111 includes an eleventh thin film transistor (TFT) T11. A gate and a source of the eleventh TFT T11 are coupled to the start signal terminal SW, and a drain of the eleventh TFT T11 is coupled to the control node Qa of the ath-stage GOA unit. The eleventh TFT T11 receives, from the start signal terminal STV, the activation signal which turns on the eleventh TFT T11. The drain of the eleventh TFT T11 transmits the activation signal from the start signal terminal STV to the control node Qa of the ath-stage GOA unit and causes the control node Qa of the ath-stage GOA unit to be at the first high electric potential.

Referring to FIG. 3, in each second GOA unit 200, the second pull-up control circuit 112 is configured to, in a first period, receive a (b−1)th-stage activation signal and a driving signal of a (b−1)th-stage gate signal terminal, pull up a control node Qn of the bth-stage GOA unit to the first high electric potential and charge the bootstrap capacitor Cb.

In the present embodiment, the second pull-up control circuit 112 is coupled to a stage transfer signal terminal STb−1 and a gate signal terminal Gb−1 of a (b−1)th-stage GOA unit, the control node Qb of the bth-stage GOA unit, and the reset circuit 150 of a present stage. The activation signal is from the stage transfer signal terminal STb−1 of the (b−1)th-stage GOA unit.

In the first period, the first pull-up control circuit 111 receives the activation signal from the stage transfer signal terminal STb−1 of the (b−1)th-stage GOA unit and causes, in response to the gate driving signal received from the gate signal terminal Gb−1 of the (b−1)th-stage GOA unit, the control node Qn of the bth-stage GOA unit to be at the first high electric potential.

In the present embodiment, the second pull-up control circuit 112 includes an eleventh TFT T11. A gate and a source of the eleventh TFT T11 is coupled to the stage transfer signal terminal STb−1 of the (b−1)th-stage GOA unit, a source of the eleventh TFT T11 is coupled to the gate signal terminal Gb−1 of the (b−1)th-stage GOA unit, and a drain of the eleventh TFT T11 is coupled to the control node Qb of the bth-stage GOA unit and the reset circuit 150. The eleventh TFT T11 receives, from the stage transfer signal terminal STb−1 of the (b−1)th-stage GOA unit, the activation signal which turns on the eleventh TFT T11. The drain of the eleventh TFT T11 transmits the driving signal from the gate signal terminal Gb−1 of the (b−1)th-stage GOA unit to the control node Qb of the bth-stage GOA unit and causes the control node Qb of the bth-stage GOA unit to be at the first high electric potential.

In the present embodiment, referring to FIG. 1, the first value set A is a set of positive integers ranging from 1 to 12. The first value set A is {1,2,3,4,5,6,7,8,9,10,11,12}. That is, a first-stage GOA unit to a twelfth-stage GOA unit are the at least one first GOA unit 100. For an 8K display panel, a 13th-stage GOA unit to a 4096th-stage GOA unit are the at least one second GOA unit 200.

In the present embodiment, positions and the number of the at least one first GOA unit 100 are not limited by the aforementioned consecutive set and can be randomly configured on the basis of at least one specific requirement. For example, the at least one first GOA unit 100 and the at least one second GOA unit 200 are alternately arranged. Or a third type of a structure of a GOA unit and so on, which are not specifically limited in the present disclosure, can be added.

Referring to FIG. 2, if the reset circuit 150 in FIG. 3 is added a structure in FIG. 2, the eleventh TFT T11 and a forty-fourth TFT T44 are turned on at the same time by the start signal terminal STV. A high electric potential start signal of the eleventh TFT T11 (i.e., a high electric potential sent from the start signal) is directly coupled to a first DC low electric potential terminal VSSQ. Thus, a larger current triggers overcurrent protection of a product, resulting in an abnormal black screen of the product. In the present disclosure, a structure of the at least one initial-stage GOA unit and a structure of at least one non-initial-stage GOA unit are separately configured. The reset circuit 150 in each of the at least one initial-stage GOA unit is eliminated, avoiding the technical problem of the abnormal black screen in the initial period.

Referring to FIGS. 2 and 3, in the second period, the bootstrap capacitor Cb is configured to hold the electric potential of the control node Qn of the nth-stage GOA unit at the first high electric potential.

In the present embodiment, the bootstrap capacitor Cb is coupled to the control node Qn of the nth-stage GOA unit, the gate signal terminal Gn of the nth-stage GOA unit, the pull-down holding circuit 140, and the pull-up circuit 120.

A first terminal of the bootstrap capacitor Cb is coupled to the control node Qn of the nth-stage GOA unit and the pull-up circuit 120, and a second terminal of the bootstrap capacitor Cb is coupled to the gate signal terminal Gn of the nth-stage GOA unit and the pull-down holding circuit 140.

In the second period, in each first GOA unit 100, the eleventh TFT T11 is turned off. The activation signal from the start signal terminal SW cannot cause the electric potential of the control node Qa of the ath-stage GOA unit to keep at the first high electric potential. At this time, the bootstrap capacitor Cb causes the electric potential of the control node Qa of the ath-stage GOA unit to continue to keep at the first high electric potential. Or in each second GOA unit 200, the eleventh TFT T11 is turned off. The activation signal from the stage transfer signal terminal STb−1 of the (b−1)th-stage GOA unit cannot turn on the eleventh TFT T11. The driving signal output from the gate signal terminal Gn of the (b−1)th-stage GOA unit cannot cause the electric potential of the control node Qb of the bth-stage GOA unit to keep at the first high electric potential. At this time, the bootstrap capacitor Cb causes the electric potential of the control node Qb of the bth-stage GOA unit to continue to keep at the first high electric potential.

In the present embodiment, the pull-up circuit 120 is configured to, in response to the clock signal and the first high electric potential of the control node Qn of the nth-stage GOA unit, output the gate driving signal to the gate signal terminal Gn of the nth-stage GOA unit.

In the present embodiment, the pull-up circuit 120 is coupled to the control node Qn of the nth-stage GOA unit, a clock signal terminal CK, a stage transfer signal terminal STn of the nth-stage GOA unit, and the nth-stage gate signal terminal Gn.

In the present embodiment, the clock signal terminal CK is for providing the clock signal.

In the present embodiment, the electric potential of the control node Qn of the nth-stage GOA unit is for controlling whether TFTs in the pull-up circuit 120 are turned on or off.

In the gate driving circuit of the present disclosure, the pull-up circuit 120 includes a twenty-first TFT T21 and a twenty-second TFT T22.

A gate of the twenty-first TFT T21 is coupled to the control node Qn of the nth-stage GOA unit, a source of the twenty-first TFT T21 is coupled to the clock signal terminal CK, and a drain of the twenty-first TFT T21 is coupled to the nth-stage gate signal terminal Gn.

A gate of the twenty-second TFT T22 is coupled to the control node Qn of the nth-stage GOA unit, a source of the twenty-second TFT T22 is coupled to the clock signal terminal CK, and a drain of the twenty-second TFT T22 is coupled to the stage transfer signal terminal STn of the nth-stage GOA unit.

The first high electric potential of the control node Qn of the nth-stage GOA unit turns on the twenty-first TFT T21 and the twenty-second TFT T22. The drain of the twenty-first TFT T21 is coupled to the nth-stage gate signal terminal Gn to output the gate driving signal to the nth-stage scan line. The drain of the twenty-second TFT T22 is coupled to the stage transfer signal terminal STn of the nth-stage GOA unit from which another activation signal is output to control whether a next-stage GOA unit is turned on or off.

Referring to FIGS. 2 and 3, in the third period, the pull-down circuit 130 is configured to, in the third period, pull down the electric potential of the control node Qn of the nth-stage GOA unit to the first DC low electric potential and pull down the electric potential of the gate signal terminal Gn of the nth-stage GOA unit to the second DC low electric potential.

In the present embodiment, the pull-down circuit 130 is coupled to the control node Qn of the nth-stage GOA unit, the gate signal terminal Gn of the nth-stage GOA unit, a gate signal terminal Gn+1 of an (n+1)th-stage GOA unit, the first DC low electric potential terminal VSSQ and a second DC low electric potential terminal VSSG.

In the present embodiment, the first DC low electric potential terminal VSSQ provides the first DC low electric potential, and the second DC low electric potential terminal VSSG provides the second DC low electric potential.

In the present embodiment, the third period starts when the gate signal terminal Gn+1 of the (n+1)th-stage GOA unit is at a high electric potential.

In the present embodiment, the pull-down circuit 130 includes a thirty-first TFT T31 and a forty-first TFT T41.

A source of the thirty-first TFT T31 is coupled to the gate signal terminal Gn of the nth-stage GOA unit, and a source of the forty-first TFT T41 is coupled to the control node Qn of the nth-stage GOA unit.

The thirty-first TFT T31 is coupled to the second DC low electric potential terminal VSSG, and a drain of the forty-first TFT T41 is coupled to the first DC low electric potential terminal VSSQ.

A gate of the thirty-first TFT T31 and a gate of the forty-first TFT T41 are coupled to the gate signal terminal Gn+1 of the (n+1)th-stage GOA unit.

When the gate signal terminal Gn+1 of the (n+1)th-stage GOA unit is at the high electric potential, the thirty-first TFT T31 and the forty-first TFT T41 are turned on. The control node Qn of the nth-stage GOA unit is pulled down to the first DC low electric potential. The gate signal terminal Gn of the nth-stage GOA unit is pulled down to the second DC low electric potential.

Referring to FIGS. 2 and 3, in the fourth period, the pull-down holding circuit 140 is configured to, in a fourth period, hold the electric potential of the control node Qn of the nth-stage GOA unit at the first DC low electric potential and hold the electric potential of the gate signal terminal Gn of the nth-stage GOA unit at the second DC low electric potential.

In the present embodiment, the pull-down holding circuit 140 includes a first pull-down holding unit 141 and a second pull-down holding unit 142. The first pull-down holding unit 141 is coupled to a first high voltage signal, the control node Qn of the nth-stage GOA unit, the gate signal terminal Gn of the nth-stage GOA unit, the first DC low electric potential terminal VSSQ, and the second DC low electric potential terminal VSSG. The second pull-down holding unit 142 is coupled to a second high voltage signal, the control node Qn of the nth-stage GOA unit, the gate signal terminal Gn of the nth-stage GOA unit, the first DC low electric potential terminal VSSQ, and the second DC low electric potential terminal VSSG.

In the present embodiment, the first high voltage signal is from a first high voltage DC signal terminal LC1, and the second high voltage signal is from a second high voltage DC signal terminal LC2.

In the present embodiment, a period of the first high voltage signal and the second high voltage signal is 200 times a frame period. The first high voltage signal and the second high voltage signal are low frequency signals having a duty cycle of 50%. A phase difference between the first high voltage signal and the second high voltage signal is ½.

The first pull-down holding unit 141 includes a fifty-first TFT T51, a fifty-second TFT T52, a fifty-third TFT T53, a fifty-fourth TFT T54, a forty-second TFT T42, and a thirty-second TFT T32.

A gate and a drain of the fifty-first TFT T51 are coupled to the first high voltage DC signal terminal LC1. A source of the fifty-first TFT T51 is electrically coupled to a drain of the fifty-second TFT T52, and a gate of the fifty-third TFT T53.

A gate of the fifty-second TFT T52 is electrically coupled to an output terminal of the pull-up control circuit. A source of the fifty-second TFT T52 is electrically coupled to the first DC low electric potential terminal VSSQ.

A drain of the fifty-third TFT T53 is coupled to the first high voltage DC signal terminal LC1. A source of the fifty-third TFT T53 is electrically coupled to a drain of the fifty-fourth TFT T54, a gate of the forty-second TFT T42, and a gate of the thirty-second TFT T32.

A gate of the fifty-fourth TFT T54 is electrically coupled to the output terminal of the pull-up control circuit. A source of the fifty-fourth TFT T54 is electrically coupled to the first DC low electric potential terminal VSSQ.

A source of the forty-second TFT T42 is electrically coupled to the first DC low electric potential terminal VSSQ. A drain of the forty-second TFT T42 is electrically coupled to the output terminal of the pull-up control circuit.

A source of the thirty-second TFT T32 is electrically coupled to the second DC low electric potential terminal VSSG. A drain of the thirty-second TFT T32 is electrically coupled to an output terminal of a scan signal of the present stage.

The second pull-down holding unit 142 includes a sixty-first TFT T61, a sixty-second TFT T62, a sixty-third TFT T63, a sixty-fourth TFT T64, a forty-third TFT T43, and a thirty-third TFT T33.

A gate and a drain of the sixty-first TFT T61 are coupled to the second high voltage DC signal terminal LC2. A source of the sixty-first TFT T61 is electrically coupled to a drain of the sixty-second TFT T62, and a gate of the sixty-third TFT T63.

A gate of the sixty-second TFT T62 is electrically coupled to the output terminal of the pull-up control circuit. A source of the sixty-second TFT T62 is electrically coupled to the first DC low electric potential terminal VSSQ.

A drain of the sixty-third TFT T63 is coupled to the second high voltage DC signal terminal LC2. A source of the sixty-third TFT T63 is electrically coupled to a drain of the sixty-fourth TFT T64, a gate of the forty-third TFT T43, and a gate of the thirty-third TFT T33.

A gate of the sixty-fourth TFT T64 is electrically coupled to the output terminal of the pull-up control circuit. A source of the sixty-fourth TFT T64 is electrically coupled to the first DC low electric potential terminal VSSQ.

A source of the forty-third TFT T43 is electrically coupled to the first DC low electric potential terminal VSSQ. A drain of the forty-third TFT T43 is electrically coupled to the output terminal of the pull-up control circuit.

A source of the thirty-third TFT T33 is electrically coupled to the second DC low electric potential terminal VSSG. A drain of the thirty-third TFT T33 is electrically coupled to the output terminal of a scan signal of the present stage.

In the fifth period after the fourth period, referring to FIG. 3, for each second GOA unit 200 including the reset circuit 150, the reset circuit 150 includes a forty-fourth TFT T44. A gate of the forty-fourth TFT T44 is coupled to the start signal terminal SW, a source of the forty-fourth TFT T44 is coupled to the control node Qb of the bth-stage GOA unit, and a drain of the forty-fourth TFT T44 is coupled to the first DC low electric potential terminal VSSQ.

In the fifth period, the forty-fourth TFT T44 is turned on by the start signal terminal SW. The electric potential of the control node Qb of the bth-stage GOA unit is pulled down by the first DC low electric potential terminal VSSQ to the first DC low electric potential.

In the present embodiment, except for the first-stage GOA unit to the twelfth-stage GOA unit, the forty-fourth TFT T44 in each second GOA unit 200 is turned on upon receiving a high electric potential input by the start signal terminal SW. The electric potential of the control node Qb in each second GOA unit 200 is pulled down to the first DC low electric potential. That is, the electric potential of the control node Qb is reset, facilitating faster and better discharge of the control node after each GOA unit operates for one cycle. The electric potential of the control node Qb is prevented from, during a process of powering on and off the display panel multiple times, being unable to discharge in time, which causes a large current. Thus, reliability of a circuit is further improved.

The present disclosure also provides a display panel including the aforementioned gate driving circuit. An operating principle of the display panel is same as or similar to an operating principle of the aforementioned gate driving circuit, and is omitted here.

The present disclosure provides the gate driving circuit and the display panel. The gate driving circuit includes the at least one first GOA unit and the at least one second GOA unit which are cascaded. Each first GOA unit and each second GOA unit include the pull-up control circuit, the bootstrap capacitor, the pull-up circuit, the pull-down circuit, and the pull-down holding circuit. Each second GOA unit further includes the reset circuit. In the present disclosure, the reset circuit in each of the at least one initial-stage GOA unit is eliminated by configuring, in the different stages, the GOA units having the different structures, respectively. The technical problem that in the initial period, the reset circuit causes the start signal and the low electric potential source to be short-circuited, resulting in the abnormal black screen of the product is avoided.

It can be understood that, to persons of ordinary skilled in the art, in accordance with the technical solutions of the present disclosure and an inventive concept thereof, equivalent replacements or changes can be made. All of these changes and replacements should fall within the protection scopes of the appended claims of the present disclosure.

What is claimed is:

1. A gate driving circuit, comprising: N gate driver on array (GOA) units; wherein the N GOA units are cascaded; wherein the N GOA units comprise at least one first GOA unit and at least one second GOA unit; wherein an nth-stage GOA unit is configured to output a gate driving signal to an nth-stage scan line; wherein the nth-stage GOA unit is any one of the N GOA units; and wherein any one of each first GOA unit and each second GOA unit comprises:
   a pull-up control circuit configured to, in a first period, pull up a control node (Qn) of the nth-stage GOA unit to a first high electric potential and charge a bootstrap capacitor;
   the bootstrap capacitor configured to, in a second period, hold an electric potential of the control node (Qn) of the nth-stage GOA unit at the first high electric potential;
   a pull-up circuit configured to, in response to a clock signal and the first high electric potential of the control node (Qn) of the nth-stage GOA unit, output the gate driving signal to a gate signal terminal (Gn) of the nth-stage GOA unit;
   a pull-down circuit configured to, in a third period, pull down the electric potential of the control node (Qn) of the nth-stage GOA unit to a first direct current (DC) low electric potential and pull down an electric potential of the gate signal terminal (Gn) of the nth-stage GOA unit to a second DC low electric potential; and
   a pull-down holding circuit configured to, in a fourth period, hold the electric potential of the control node (Qn) of the nth-stage GOA unit at the first DC low electric potential and hold the electric potential of the gate signal terminal (Gn) of the nth-stage GOA unit at the second DC low electric potential;
   wherein the pull-up control circuit is electrically coupled to the pull-up circuit, the pull-down circuit, the pull-down holding circuit, and the bootstrap capacitor; wherein the first DC low electric potential is electrically coupled to the pull-down holding circuit and the pull-down circuit; wherein the second DC low electric potential is electrically coupled to the pull-down holding circuit and the pull-down circuit; and wherein a clock signal terminal (CK) is electrically coupled to the pull-up circuit;
   wherein each second GOA unit further comprises a reset circuit configured to, in a fifth period, reset an electric potential of the control node (Qn); and wherein the reset circuit is electrically coupled to the pull-up control circuit and the first DC low electric potential.

2. The gate driving circuit of claim 1, wherein each first GOA unit comprises a first pull-up control circuit coupled to a start signal terminal (SW) and a control node (Qa) of an ath-stage GOA unit;
   wherein each second GOA unit comprises a second pull-up control circuit coupled to a stage transfer signal terminal (STb−1) and a gate signal terminal (Gb−1) of a (b−1)th-stage GOA unit, a control node (Qb) of a bth-stage GOA unit, and the reset circuit of a present stage;
   wherein a value range of a is a first value set, a value range of b is a second value set, intersection of the first value set and the second value set is an empty set, $1 \le a \le n$, $1 \le b \le n$, a, b and n are positive integers, and a is not equal to b.

3. The gate driving circuit of claim 2, wherein the first value set is a set of positive integers ranging from 1 to 12.

4. The gate driving circuit of claim 2, wherein the first pull-up control circuit comprises an eleventh thin film transistor (TFT) (T11); and wherein a gate and a source of the eleventh TFT (T11) are coupled to the start signal terminal (STV), and a drain of the eleventh TFT (T11) is coupled to the control node (Qa) of the ath-stage GOA unit;
   wherein the second pull-up control circuit comprises an eleventh TFT (T11); and wherein a gate of the eleventh TFT (T11) is coupled to the stage transfer signal terminal (STb−1) of the (b−1)th-stage GOA unit, a source of the eleventh TFT (T11) is coupled to the gate signal terminal (Gb−1) of the (b−1)th-stage GOA unit, and a drain of the eleventh TFT (T11) is coupled to the control node (Qb) of the bth-stage GOA unit.

5. The gate driving circuit of claim 2, wherein the bootstrap capacitor is coupled to the control node (Qn) of the nth-stage GOA unit, the gate signal terminal (Gn) of the nth-stage GOA unit, the pull-down holding circuit, and the pull-up circuit;
   wherein a first terminal of the bootstrap capacitor is coupled to the control node (Qn) of the nth-stage GOA unit and the pull-up circuit, and a second terminal of the bootstrap capacitor is coupled to the gate signal terminal (Gn) of the nth-stage GOA unit and the pull-down holding circuit.

6. The gate driving circuit of claim 2, wherein the pull-up circuit is coupled to the control node (Qn) of the nth-stage GOA unit, the clock signal terminal (CK), a stage transfer signal terminal (STn) of the nth-stage GOA unit, and the nth-stage gate signal terminal (Gn);
   wherein the pull-up circuit comprises a twenty-first TFT (T21) and a twenty-second TFT (T22);
   wherein a gate of the twenty-first TFT (T21) is coupled to the control node (Qn) of the nth-stage GOA unit, a source of the twenty-first TFT (T21) is coupled to the clock signal terminal (CK), and a drain of the twenty-first TFT (T21) is coupled to the nth-stage gate signal terminal (Gn);
   wherein a gate of the twenty-second TFT (T22) is coupled to the control node (Qn) of the nth-stage GOA unit, a source of the twenty-second TFT (T22) is coupled to the clock signal terminal (CK), and a drain of the twenty-second TFT (T22) is coupled to the stage transfer signal terminal (STn) of the nth-stage GOA unit.

7. The gate driving circuit of claim 2, wherein the pull-down circuit is coupled to the control node (Qn) of the nth-stage GOA unit, the gate signal terminal (Gn) of the nth-stage GOA unit, a gate signal terminal (Gn+1) of an (n+1)th-stage GOA unit, and a second DC low electric potential terminal (VSSG);
   wherein the first DC low electric potential terminal (VSSQ) provides the first DC low electric potential, and the second DC low electric potential terminal (VSSG) provides the second DC low electric potential;
   wherein the pull-down circuit comprises a thirty-first TFT (T31) and a forty-first TFT (T41);
   wherein a source of the thirty-first TFT (T31) is coupled to the gate signal terminal (Gn) of the nth-stage GOA unit, and a source of the forty-first TFT (T41) is coupled to the control node (Qn) of the nth-stage GOA unit;

wherein the thirty-first TFT (T31) is coupled to the second DC low electric potential terminal (VSSG), and a drain of the forty-first TFT (T41) is coupled to the first DC low electric potential terminal (VSSQ);

wherein a gate of the thirty-first TFT (T31) and a gate of the forty-first TFT (T41) are coupled to the gate signal terminal (Gn+1) of the (n+1)th-stage GOA unit.

8. The gate driving circuit of claim 2, wherein the pull-down holding circuit comprises a first pull-down holding unit and a second pull-down holding unit;

wherein the first pull-down holding unit is coupled to a first high voltage signal, the control node (Qn) of the nth-stage GOA unit, the gate signal terminal (Gn) of the nth-stage GOA unit, a first DC low electric potential terminal (VSSQ), and a second DC low electric potential terminal (VSSG);

wherein the second pull-down holding unit is coupled to a second high voltage signal, the control node (Qn) of the nth-stage GOA unit, the gate signal terminal (Gn) of the nth-stage GOA unit, a first DC low electric potential terminal (VSSQ), and a second DC low electric potential terminal (VSSG).

9. The gate driving circuit of claim 8, wherein a period of the first high voltage signal and the second high voltage signal is a multiple of a frame period; wherein the first high voltage signal and the second high voltage signal are low frequency signals having a duty cycle of 50%; and wherein a phase difference between the first high voltage signal and the second high voltage signal is ½.

10. The gate driving circuit of claim 2, wherein in each second GOA unit, the reset circuit comprises a forty-fourth TFT (T44); and wherein a gate of the forty-fourth TFT (T44) is coupled to the start signal terminal (STV), a source of the forty-fourth TFT (T44) is coupled to the control node (Qb) of the bth-stage GOA unit, and a drain of the forty-fourth TFT (T44) is coupled to the first DC low electric potential terminal (VSSQ).

11. A display panel, comprising: a gate driving circuit comprising N gate driver on array (GOA) units; wherein the N GOA units are cascaded; wherein the N GOA units comprise at least one first GOA unit and at least one second GOA unit; wherein an nth-stage GOA unit is configured to output a gate driving signal to an nth-stage scan line; wherein the nth-stage GOA unit is any one of the N GOA units; and wherein any one of each first GOA unit and each second GOA unit comprises:

a pull-up control circuit configured to, in a first period, pull up a control node (Qn) of the nth-stage GOA unit to a first high electric potential and charge a bootstrap capacitor;

the bootstrap capacitor configured to, in a second period, hold an electric potential of the control node (Qn) of the nth-stage GOA unit at the first high electric potential;

a pull-up circuit configured to, in response to a clock signal and the first high electric potential of the control node (Qn) of the nth-stage GOA unit, output the gate driving signal to a gate signal terminal (Gn) of the nth-stage GOA unit;

a pull-down circuit configured to, in a third period, pull down the electric potential of the control node (Qn) of the nth-stage GOA unit to a first direct current (DC) low electric potential and pull down an electric potential of the gate signal terminal (Gn) of the nth-stage GOA unit to a second DC low electric potential; and a pull-down holding circuit configured to, in a fourth period, hold the electric potential of the control node (Qn) of the nth-stage GOA unit at the first DC low electric potential and hold the electric potential of the gate signal terminal (Gn) of the nth-stage GOA unit at the second DC low electric potential;

wherein the pull-up control circuit is electrically coupled to the pull-up circuit, the pull-down circuit, the pull-down holding circuit, and the bootstrap capacitor; wherein the first DC low electric potential is electrically coupled to the pull-down holding circuit and the pull-down circuit; wherein the second DC low electric potential is electrically coupled to the pull-down holding circuit and the pull-down circuit; and wherein a clock signal terminal (CK) is electrically coupled to the pull-up circuit;

wherein each second GOA unit further comprises a reset circuit configured to, in a fifth period, reset an electric potential of the control node (Qn); and wherein the reset circuit is electrically coupled to the pull-up control circuit and the first DC low electric potential.

12. The display panel of claim 11, wherein each first GOA unit comprises a first pull-up control circuit coupled to a start signal terminal (SW) and a control node (Qa) of an ath-stage GOA unit;

wherein each second GOA unit comprises a second pull-up control circuit coupled to a stage transfer signal terminal (STb−1) and a gate signal terminal (Gb−1) of a (b−1)th-stage GOA unit, a control node (Qb) of a bth-stage GOA unit, and the reset circuit of a present stage;

wherein a value range of a is a first value set, a value range of b is a second value set, intersection of the first value set and the second value set is an empty set, 1≤a≤n, 1≤b≤n, a, b and n are positive integers, and a is not equal to b.

13. The display panel of claim 12, wherein the first value set is a set of positive integers ranging from 1 to 12.

14. The display panel of claim 12, wherein the first pull-up control circuit comprises an eleventh thin film transistor (TFT) (T11); and wherein a gate and a source of the eleventh TFT (T11) are coupled to the start signal terminal (STV), and a drain of the eleventh TFT (T11) is coupled to the control node (Qa) of the ath-stage GOA unit;

wherein the second pull-up control circuit comprises an eleventh TFT (T11); and wherein a gate of the eleventh TFT (T11) is coupled to the stage transfer signal terminal (STb−1) of the (b−1)th-stage GOA unit, a source of the eleventh TFT (T11) is coupled to the gate signal terminal (Gb−1) of the (b−1)th-stage GOA unit, and a drain of the eleventh TFT (T11) is coupled to the control node (Qb) of the bth-stage GOA unit.

15. The display panel of claim 12, wherein the bootstrap capacitor is coupled to the control node (Qn) of the nth-stage GOA unit, the gate signal terminal (Gn) of the nth-stage GOA unit, the pull-down holding circuit, and the pull-up circuit;

wherein a first terminal of the bootstrap capacitor is coupled to the control node (Qn) of the nth-stage GOA unit and the pull-up circuit, and a second terminal of the bootstrap capacitor is coupled to the gate signal terminal (Gn) of the nth-stage GOA unit and the pull-down holding circuit.

16. The display panel of claim 12, wherein the pull-up circuit is coupled to the control node (Qn) of the nth-stage GOA unit, the clock signal terminal (CK), a stage transfer signal terminal (STn) of the nth-stage GOA unit, and the nth-stage gate signal terminal (Gn);

wherein the pull-up circuit comprises a twenty-first TFT (T21) and a twenty-second TFT (T22);

wherein a gate of the twenty-first TFT (T21) is coupled to the control node (Qn) of the nth-stage GOA unit, a source of the twenty-first TFT (T21) is coupled to the clock signal terminal (CK), and a drain of the twenty-first TFT (T21) is coupled to the nth-stage gate signal terminal (Gn);

wherein a gate of the twenty-second TFT (T22) is coupled to the control node (Qn) of the nth-stage GOA unit, a source of the twenty-second TFT (T22) is coupled to the clock signal terminal (CK), and a drain of the twenty-second TFT (T22) is coupled to the stage transfer signal terminal (STn) of the nth-stage GOA unit.

17. The display panel of claim 12, wherein the pull-down circuit is coupled to the control node (Qn) of the nth-stage GOA unit, the gate signal terminal (Gn) of the nth-stage GOA unit, a gate signal terminal (Gn+1) of an (n+1)th-stage GOA unit, and a second DC low electric potential terminal (VSSG);

wherein the first DC low electric potential terminal (VSSQ) provides the first DC low electric potential, and the second DC low electric potential terminal (VSSG) provides the second DC low electric potential;

wherein the pull-down circuit comprises a thirty-first TFT (T31) and a forty-first TFT (T41);

wherein a source of the thirty-first TFT (T31) is coupled to the gate signal terminal (Gn) of the nth-stage GOA unit, and a source of the forty-first TFT (T41) is coupled to the control node (Qn) of the nth-stage GOA unit;

wherein the thirty-first TFT (T31) is coupled to the second DC low electric potential terminal (VSSG), and a drain of the forty-first TFT (T41) is coupled to the first DC low electric potential terminal (VSSQ);

wherein a gate of the thirty-first TFT (T31) and a gate of the forty-first TFT (T41) are coupled to the gate signal terminal (Gn+1) of the (n+1)th-stage GOA unit.

18. The display panel of claim 12, wherein the pull-down holding circuit comprises a first pull-down holding unit and a second pull-down holding unit;

wherein the first pull-down holding unit is coupled to a first high voltage signal, the control node (Qn) of the nth-stage GOA unit, the gate signal terminal (Gn) of the nth-stage GOA unit, a first DC low electric potential terminal (VSSQ), and a second DC low electric potential terminal (VSSG);

wherein the second pull-down holding unit is coupled to a second high voltage signal, the control node (Qn) of the nth-stage GOA unit, the gate signal terminal (Gn) of the nth-stage GOA unit, a first DC low electric potential terminal (VSSQ), and a second DC low electric potential terminal (VSSG).

19. The display panel of claim 18, wherein a period of the first high voltage signal and the second high voltage signal is a multiple of a frame period; wherein the first high voltage signal and the second high voltage signal are low frequency signals having a duty cycle of 50%; and wherein a phase difference between the first high voltage signal and the second high voltage signal is ½.

20. The display panel of claim 12, wherein in each second GOA unit, the reset circuit comprises a forty-fourth TFT (T44); and wherein a gate of the forty-fourth TFT (T44) is coupled to the start signal terminal (STV), a source of the forty-fourth TFT (T44) is coupled to the control node (Qb) of the bth-stage GOA unit, and a drain of the forty-fourth TFT (T44) is coupled to the first DC low electric potential terminal (VSSQ).

* * * * *